(12) United States Patent
Song

(10) Patent No.: US 9,330,741 B2
(45) Date of Patent: May 3, 2016

(54) SEMICONDUCTOR DEVICES

(71) Applicant: SK hynix Inc., Icheon-si Gyeonggi-do (KR)

(72) Inventor: Keun Soo Song, Icheon-si Gyeonggi-do (KR)

(73) Assignee: SK HYNIX INC., Icheo-Si (KR)

( * ) Notice: Subject to any disclaimer, the term of this patent is extended or adjusted under 35 U.S.C. 154(b) by 0 days.

(21) Appl. No.: 14/465,996

(22) Filed: Aug. 22, 2014

(65) Prior Publication Data

US 2015/0235683 A1    Aug. 20, 2015

(30) Foreign Application Priority Data

Feb. 18, 2014    (KR) .................. 10-2014-0018202

(51) Int. Cl.
| | |
|---|---|
| H04L 7/00 | (2006.01) |
| H04L 25/00 | (2006.01) |
| H04L 25/40 | (2006.01) |
| G11C 7/22 | (2006.01) |
| G11C 7/10 | (2006.01) |

(52) U.S. Cl.
CPC .............. *G11C 7/222* (2013.01); *G11C 7/1093* (2013.01)

(58) Field of Classification Search
CPC ......... G06F 1/10; H04J 3/0685; H04J 3/0688; H04J 3/0638; H04J 3/076; H04J 3/0632; H04J 3/0626; H04J 3/062; H04L 7/0008; H04L 25/05

USPC ......... 375/219–220, 224–228, 242–254, 259, 375/285–294, 316, 346, 349–351, 353–376
See application file for complete search history.

(56) References Cited

U.S. PATENT DOCUMENTS

| | | | |
|---|---|---|---|
| 2008/0005518 | A1 | 1/2008 | Gillingham et al. |
| 2014/0055184 | A1* | 2/2014 | Vankayala ............... G06F 1/12 327/161 |

FOREIGN PATENT DOCUMENTS

KR    1020080048378 A    6/2008

* cited by examiner

*Primary Examiner* — James M Perez
(74) *Attorney, Agent, or Firm* — William Park & Associates Ltd.

(57) ABSTRACT

A semiconductor device including a data aligner that aligns input data in response to internal strobe signals obtained by dividing a data strobe signal to generate a first alignment data and a second alignment data. The semiconductor device may also include a phase sensor that generates a control clock signal in response to a clock signal and senses phases of the internal strobe signals with the control clock signal to generate a selection signal, and a data selector that selectively outputs the first and second alignment data as a first selection alignment data and a second selection alignment data in response to the selection signal.

20 Claims, 16 Drawing Sheets

SEMICONDUCTOR DEVICES

CROSS-REFERENCE TO RELATED APPLICATION

The present application claims priority under 35 U.S.C. 119(a) to Korean Application No. 10-2014-0018202, filed on Feb. 18, 2014, in the Korean Intellectual Property Office, which is incorporated herein by reference in its entirety as set forth in full.

BACKGROUND

1. Technical Field

Embodiments of the present disclosure generally relate to semiconductor devices.

2. Related Art

As semiconductor systems are developed to operate at high speeds, high data transmission rates (or data communication at high bandwidths) between semiconductor devices constituting each semiconductor system have been increasingly in demand. In response to such demands, various pre-fetch schemes have been proposed. Pre-fetch schemes may correspond to design techniques that latch data inputted in series and output the latched data in parallel. To obtain the parallel data, clock signals having different phases, for example, multi-phase internal clock signals are generated in the semiconductor devices and multi-phase internal clock signals are used to input or output the data.

SUMMARY

Various examples of embodiments may be directed toward, for example but not limited to, semiconductor devices.

According to various embodiments, a semiconductor device may include a data aligner, a phase sensor and a data selector. The data aligner may align input data in response to internal strobe signals obtained by dividing a data strobe signal to generate a first alignment data and a second alignment data. The phase sensor may generate a control clock signal in response to a clock signal and may sense phases of the internal strobe signals with the control clock signal to generate a selection signal. The data selector may selectively output the first and second alignment data as a first selection alignment data and a second selection alignment data in response to the selection signal.

According to various embodiments, a semiconductor device may include a data aligner and a data controller. The data aligner may align input data in response to internal strobe signals obtained by dividing a data strobe signal to generate a first alignment data and a second alignment data. The data controller may generate a control clock signal in response to a clock signal. Furthermore, the data controller may sense phases of the internal strobe signals with the control clock signal to generate a first latch signal, a second latch signal, and a selection signal. Also, the data controller may generate a data input clock signal for generation of internal data in response to the first and second latch signals.

DETAILED DESCRIPTION

Various embodiments will be described hereinafter with reference to the accompanying drawings. However, the embodiments described herein are for illustrative purposes only and are not intended to limit the scope of the inventive concept.

Figure 1:
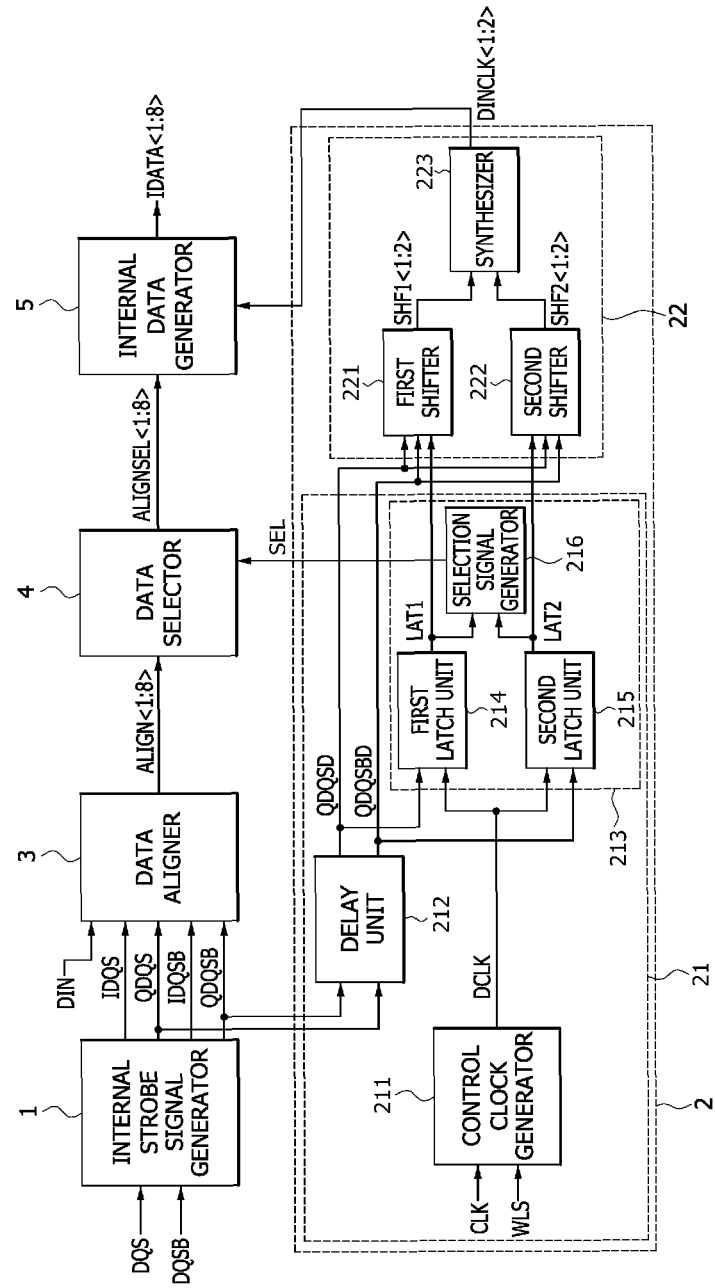
FIG. 1 is a block diagram representation illustrating a semiconductor device according to an embodiment.

Referring to FIG. 1, a semiconductor device according to an embodiment may include an internal strobe signal generator 1 and a data controller 2. The semiconductor device may also include a data aligner 3, a data selector 4, and an internal data generator 5. The data controller 2 may include a phase sensor 21 and a data input clock generator 22. The phase sensor 21 may include a control clock generator 211 and a delay unit 212. The phase sensor 21 may also include a latch synthesizer 213.

The internal strobe signal generator 1 may divide a data strobe signal DQS to generate a first internal strobe signal IDQS and a second internal strobe signal QDQS and the internal strobe signal generator 1 may divide a complementary data strobe signal DQSB to generate a third internal strobe signal IDQSB and a fourth internal strobe signal QDQSB. The internal strobe signal generator 1 may be realized using a frequency divider or may include a frequency divider. The first internal strobe signal IDQS may precede the second internal strobe signal QDQS by a phase of 90 degrees. The second internal strobe signal QDQS may precede the third internal strobe signal IDQSB by a phase of 90 degrees. The third internal strobe signal IDQSB may precede the fourth internal strobe signal QDQSB by a phase of 90 degrees. The phases and cycle times of the first, second, third, and fourth internal strobe signals IDQS, QDQS, IDQSB, and QDQSB may be set differently according to various embodiments.

In response to a clock signal CLK and a write latency signal WLS, the control clock generator 211 may generate a control clock signal DCLK. The write latency signal WLS may include information on a write latency. The configuration and operation of the control clock generator 211 will further be described below with reference to FIG. 2.

The delay unit 212 may retard the second internal strobe signal QDQS to generate a delayed strobe signal QDQSD. The delay unit 212 may retard the fourth internal strobe signal QDQSB to generate a complementary delayed strobe signal QDQSBD. A delay time that the second and fourth internal strobe signals QDQS and QDQSB are retarded by the delay unit 212 may be set to be different according to the various embodiments. In some embodiments, the delay unit 212 may be configured to buffer the second internal strobe signal QDQS to generate the delayed strobe signal QDQSD. As such, if the delay unit 212 is configured to buffer the second internal strobe signal QDQS to generate the delayed strobe signal QDQSD, the delay unit 212 may also be configured to buffer the fourth internal strobe signal QDQSB to generate the complementary delayed strobe signal QDQSBD. Alternatively, the delay unit 212 may be configured to retard the first internal strobe signal IDQS and the third internal strobe signal IDQSB.

The latch synthesizer 213 may include a first latch unit 214. The latch synthesizer 213 may also include a second latch unit 215 and a selection signal generator 216. The first latch unit 214 may latch the control clock signal DCLK in synchronization with the delayed strobe signal QDQSD to generate a first latch signal LAT1. The second latch unit 215 may latch the control clock signal DCLK in synchronization with the complementary delayed strobe signal QDQSBD to generate a second latch signal LAT2. The selection signal generator 216 may generate a selection signal SEL in response to the first and second latch signals LAT1 and LAT2. The configuration and operation of the latch synthesizer 213 will be described below with reference to FIG. 3.

The data input clock generator 22 may include a first shifter 221. The data input clock generator 22 may also include a second shifter 222 and a synthesizer 223. The first shifter 221 may shift the first latch signal LAT1 to generate a first shift signal SHF1<1:2>. The second shifter 222 may shift the second latch signal LAT2 to generate a second shift signal SHF2<1:2>. The synthesizer 223 may synthesize the first shift signal SHF1<1:2> and the second shift signal SHF2<1:2> to generate first and second data input clock signals DIN-CLK<1:2>. The configurations and operations of the first shifter 221, the second shifter 222 and the synthesizer 223 will be described below with reference to FIGS. 4 to 6.

The data aligner 3 may align data, for example, input data DIN in response to the first to fourth internal strobe signals IDQS, QDQS, IDQSB and QDQSB to generate first to eighth alignment data ALIGN<1:8>. A design scheme of the data aligner 3 aligning the data DIN may be different according to the various embodiments.

The data selector 4 may receive selection signal and may selectively output the first to eighth alignment data ALIGN<1:8> as first to eighth selection alignment data ALIGNSEL<1:8> according to a level of the selection signal SEL. The configuration and operation of the data selector 4 will be described below with reference to FIG. 7.

The internal data generator 5 may latch the first to eighth selection alignment data ALIGNSEL<1:8> in synchronization with the first and second data input clock signals DIN-CLK<1:2> to generate first to eighth internal data IDATA<1:8>. The configuration and operation of the internal data generator 5 will be described below with reference to FIG. 8.

Figure 2:
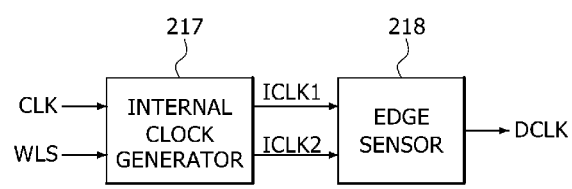
FIG. 2 is a block diagram representation illustrating a control clock generator which may be included in the semiconductor device of FIG. 1.

Referring to FIG. 2, the control clock generator 211 may include an internal clock generator 217. The control clock generator 211 may also include an edge sensor 218. The internal clock generator 217 may receive the clock signal CLK and the write latency signal WLS to generate a first internal clock signal ICLK1 and a second internal clock signal ICLK2. A pulse of the first internal clock signal ICLK1 may occur at a point of time when a write latency (WL of FIG. 11) and an integer number times a cycle of the clock signal CLK elapse from a moment that a write command signal (WT of FIG. 11) is inputted to the semiconductor device. Similarly, a pulse of the second internal clock signal ICLK2 may also occur at a point of time when the write latency WL and another integer number times a cycle of the clock signal CLK elapse from a moment that the write command signal WT is inputted to the semiconductor device. In an embodiment, the pulse of the first internal clock signal ICLK1 may occur at a point of time when the write latency WL and one cycle of the clock signal CLK elapse from a moment that the write command signal WT is inputted to the semiconductor device, and the pulse of the second internal clock signal ICLK2 may occur at a point of time when the write latency WL and two cycles of the clock signal CLK elapse from a moment that the write command signal WT is inputted to the semiconductor device. The edge sensor 218 may generate the control clock signal DCLK in response to the first and second internal clock signals ICLK1 and ICLK2. In an embodiment, the edge sensor 218 may generate the control clock signal DCLK with a clock pulse width corresponding to a period from a rising edge (a transition point from a logic "low" level to a logic "high" level) of the first internal clock signal ICLK1 until a rising edge of the second internal clock signal ICLK2. As described above, a clock pulse of the control clock signal DCLK may be generated by a phase difference (i.e., a rising edge timing difference) between the first and second internal clock signals ICLK1 and ICLK2. Thus, the control clock signal DCLK may be normally generated even though waveforms of the first and second internal clock signals ICLK1 and ICLK2 are distorted due to variations in process, voltage, and/or temperature (PVT) conditions.

A configuration of the latch synthesizer 213 will be described hereinafter with reference to FIG. 3.

Figure 3:
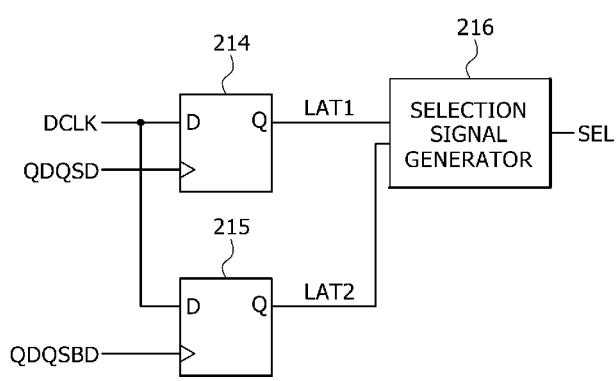
FIG. 3 is a block diagram representation illustrating a latch synthesizer which may be included in the semiconductor device of FIG. 1.

Referring to FIG. 3, each of the first and second latch units 214 and 215 may be realized using a flip-flop or include a flip-flop(s). To generate the first latch signal LAT1, the first latch unit 214 may latch the control clock signal DCLK in synchronization with a rising edge of the delayed strobe signal QDQSD. To generate the second latch signal LAT2 the second latch unit 215 may latch the control clock signal DCLK in synchronization with a rising edge of the complementary delayed strobe signal QDQSBD. The selection signal generator 216 may generate the selection signal SEL having a logic "high" level if the first latch signal LAT1 having a logic "high" level is inputted thereto. The selection signal generator 216 may generate the selection signal SEL having a logic "low" level if the second latch signal LAT1 having a logic "high" level is inputted thereto.

Figure 4:
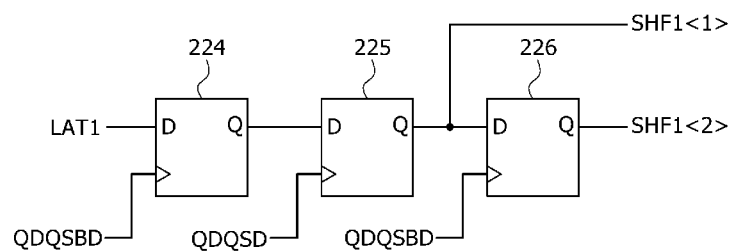
FIG. 4 is a block diagram representation illustrating a first shifter which may be included in the semiconductor device of FIG. 1.

Referring to FIG. 4, the first shifter 221 may include a first latch 224. The first shifter 221 may also include a second latch 225 and a third latch 226. Each first latch 224, second latch 225 and third latch 226 may be realized using a flip-flop or each may include a flip-flop(s). The first latch 224 may latch and output the first latch signal LAT1 in synchronization with a rising edge of the complementary delayed strobe signal QDQSBD. The second latch 225 may latch an output signal of the first latch 224 in synchronization with a rising edge of the delayed strobe signal QDQSD. The second latch 225 may output the latched signal as a first bit SHF1<1> of the first shift signal SHF1<1:2>. The third latch 226 may latch an output signal of the second latch 225 in synchronization with a rising edge of the complementary delayed strobe signal QDQSBD. The third latch 226 may output the latched signal as a second bit SHF1<2> of the first shift signal SHF1<1:2>.

Figure 5:
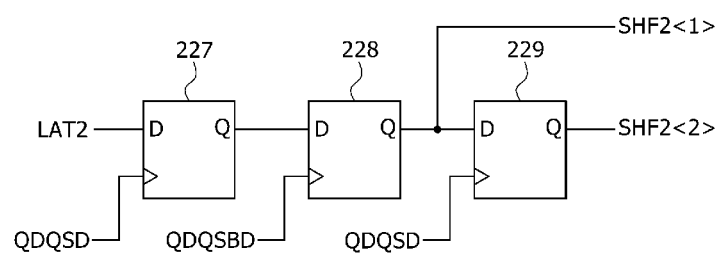
FIG. 5 is a block diagram representation illustrating a second shifter which may be included in the semiconductor device of FIG. 1.

Referring to FIG. 5, the second shifter 222 may include a fourth latch 227. The second shifter may also include a fifth latch 228 and a sixth latch 229. Each fourth latch 227, fifth latch 228 and sixth latch 229 may be realized using a flip-flop or include a flip-flop(s). The fourth latch 227 may latch and output the second latch signal LAT2 in synchronization with a rising edge of the delayed strobe signal QDQSD. The fifth latch 228 may latch an output signal of the fourth latch 227 in synchronization with a rising edge of the complementary delayed strobe signal QDQSBD. The fifth latch 228 may output the latched signal as a first bit SHF2<1> of the second shift signal SHF2<1:2>. The sixth latch 229 may latch an output signal of the fifth latch 228 in synchronization with a rising edge of the delayed strobe signal QDQSD. The sixth latch 229 may output the latched signal as a second bit SHF2<2> of the second shift signal SHF2<1:2>.

Figure 6:
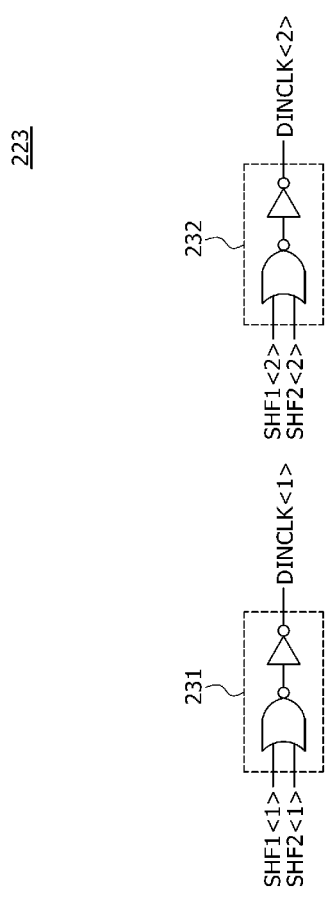
FIG. 6 is a logic circuit diagram representation illustrating a synthesizer which may be included in the semiconductor device of FIG. 1.

Referring to FIG. 6, the synthesizer 223 may include a first logic unit 231 and a second logic unit 232. The first logic unit 231 may execute an OR operation of the first bit SHF1<1> of the first shift signal SHF1<1:2> with the first bit SHF2<1> of the second shift signal SHF2<1:2>. Then the first logic unit 231 may generate the first data input clock signal DINCLK<1>. The second logic unit 232 may execute an OR operation of the second bit SHF1<2> of the first shift signal SHF1<1:2> with the second bit SHF2<2> of the second shift signal SHF2<1:2>. Then the second logic unit 232 may generate the second data input clock signal DINCLK<2>.

Figure 7:
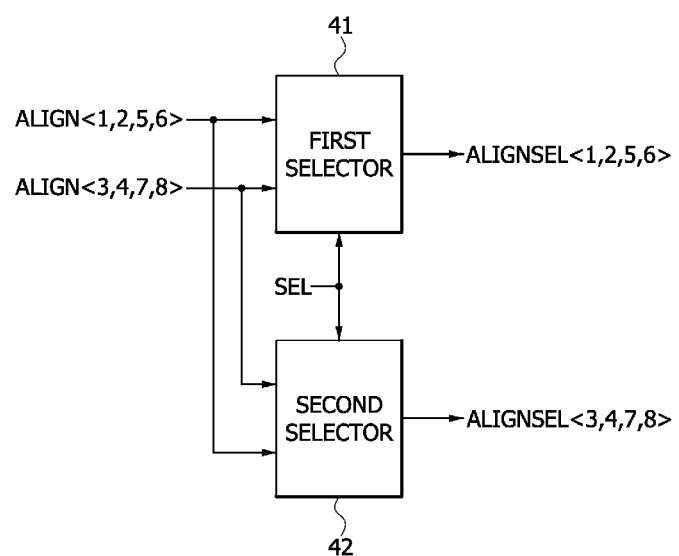
FIG. 7 is a block diagram representation illustrating a data selector which may be included in the semiconductor device of FIG. 1.

Referring to FIG. 7, the data selector 4 may include a first selector 41 and a second selector 42. As indicated by FIG. 7, the first selector 41 and the second selector 42 may be configured to receive a selection signal. As such, if the selection signal SEL has a logic "high" level, then the first selector 41 may output a first alignment data group ALIGN<1,2,5,6> as a first selection alignment data group ALIGNSEL<1,2,5,6>. If the selection signal SEL has a logic "low" level, then the first selector 41 may output a second alignment data group ALIGN<3,4,7,8> as the first selection alignment data group ALIGNSEL<1,2,5,6>. If the selection signal SEL has a logic "high" level, then the second selector 42 may output the second alignment data group ALIGN<3,4,7,8> as a second selection alignment data group ALIGNSEL<3,4,7,8>. If the selection signal SEL has a logic "low" level, then the second selector 42 may output the first alignment data group ALIGN<1,2,5,6> as the second selection alignment data group ALIGNSEL<3,4,7,8>. The first alignment data group ALIGN<1,2,5,6> may include, for example, the first alignment data ALIGN<1>, the second alignment data ALIGN<2>, the fifth alignment data ALIGN<5> and the sixth alignment data ALIGN<6>. The second alignment data group ALIGN<3,4,7,8> may include, for example, the third alignment data ALIGN<3>, the fourth alignment data ALIGN<4>, the seventh alignment data ALIGN<7> and the eighth alignment data ALIGN<8>. The first selection alignment data group ALIGNSEL<1,2,5,6> may include, for example, the first selection alignment data ALIGNSEL<1>, the second selection alignment data ALIGNSEL<2>, the fifth selection alignment data ALIGNSEL<5> and the sixth selection alignment data ALIGNSEL<6>. The second selection alignment data group ALIGNSEL<3,4,7,8> may include, for example, the third selection alignment data ALIGNSEL<3>, the fourth selection alignment data ALIGNSEL<4>, the seventh selection alignment data ALIGNSEL<7> and the eighth selection alignment data ALIGNSEL<8>.

Figure 8:
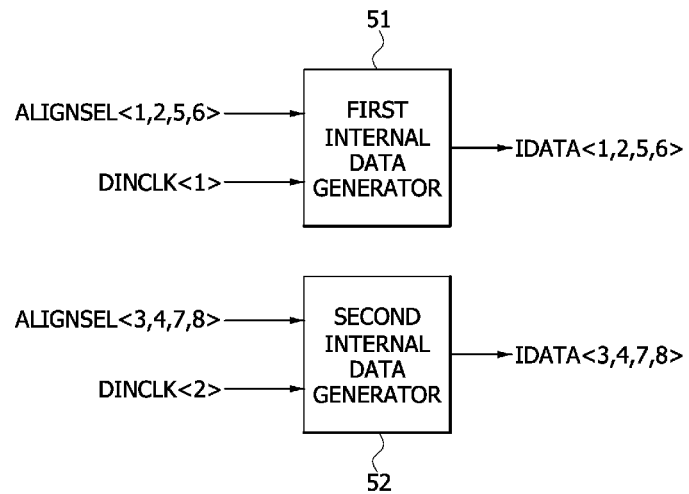
FIG. 8 is a block diagram representation illustrating an internal data generator which may be included in the semiconductor device of FIG. 1.

Referring to FIG. 8, the internal data generator 5 may include a first internal data generator 51. The internal data generator 5 may also include a second internal data generator 52. The first internal data generator 51 may latch the first selection alignment data group ALIGNSEL<1,2,5,6> in synchronization with the first data input clock signal DINCLK<1>. Then the first internal data generator 51 may generate a first internal data group IDATA<1,2,5,6>. The second internal data generator 52 may latch the second selection alignment data group ALIGNSEL<3,4,7,8> in synchronization with the second data input clock signal DINCLK<2>. Then the second internal data generator 52 may generate a second internal data group IDATA<3,4,7,8>. The first internal data group IDATA<1,2,5,6> may include the first internal data IDATA<1>, the second internal data IDATA<2>, the fifth internal data IDATA<5>, and the sixth internal data IDATA<6>. The second internal data group IDATA<3,4,7,8> may include the third internal data IDATA<3>, the fourth internal data IDATA<4>, the seventh internal data IDATA<7>, and the eighth internal data IDATA<8>.

The phases of the internal strobe signals will be described hereinafter with reference to FIG. 9 in conjunction with an example in which the first, second, third and fourth internal strobe signals IDQS, QDQS, IDQSB and QDQSB are sequentially generated to form and to have ordinary phases while the data DIN are inputted to the semiconductor device. Moreover, The phases of the internal strobe signals will be described hereinafter with reference to FIG. 10 in conjunction with an example in which the first, second, third and fourth internal strobe signals IDQS, QDQS, IDQSB and QDQSB are generated to form and to have reverse phases while the data DIN are inputted to the semiconductor device.

Figure 9:
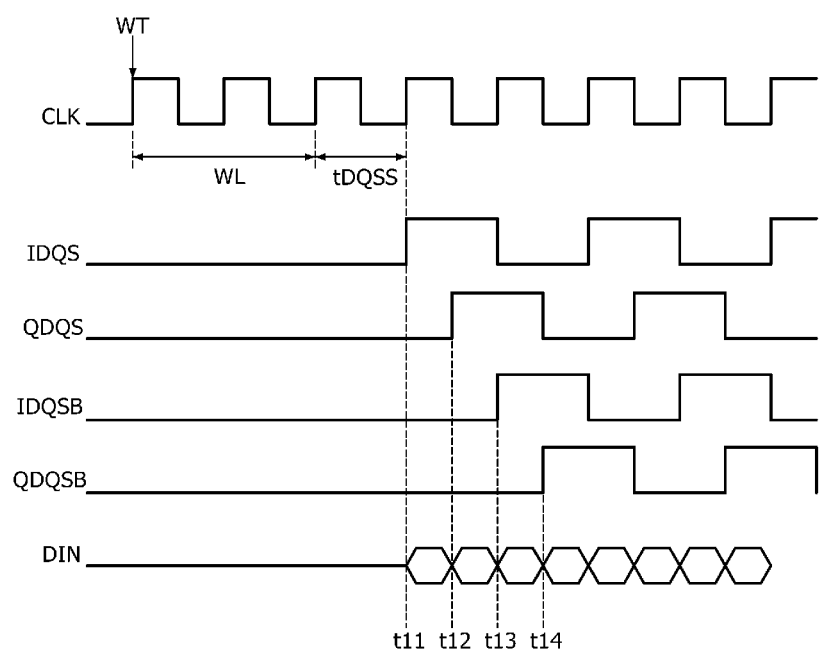
FIG. 9 is a timing diagram representation illustrating an example in which internal strobe signals have ordinary phases.
Figure 10:
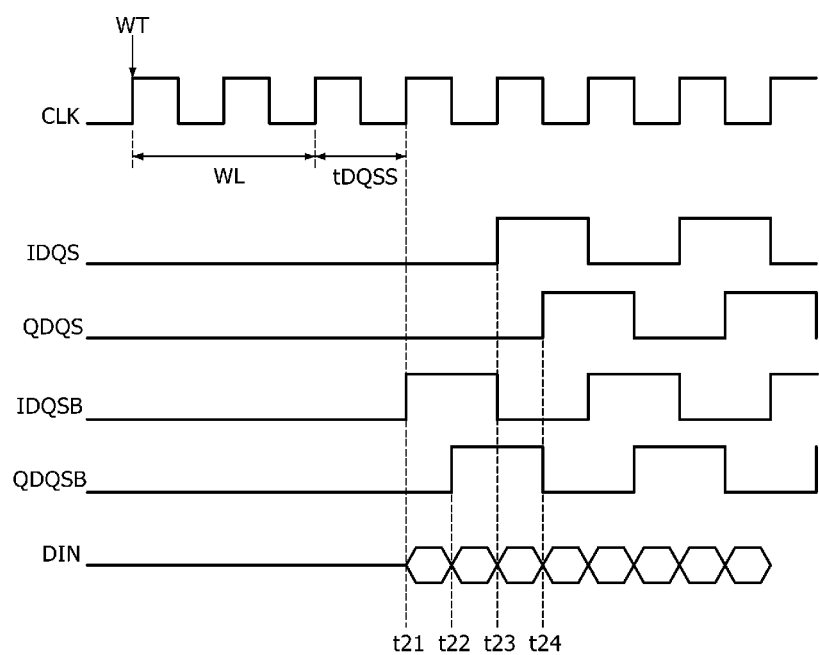
FIG. 10 is a timing diagram representation illustrating an example in which internal strobe signals have reverse phases.

As illustrated in FIG. 9, the first, second, third and fourth internal strobe signals IDQS, QDQS, IDQSB and QDQSB may be sequentially generated to form and to have ordinary phases from a point of time that the write latency WL and a period "tDQSS" elapses after the write command signal WT is inputted to the semiconductor device. That is, in the event that the first, second, third and fourth internal strobe signals IDQS, QDQS, IDQSB and QDQSB are sequentially generated at points of time "T11", "T12", "T13" and "T14", respectively, the first, second, third and fourth internal strobe signals IDQS, QDQS, IDQSB and QDQSB may be regarded as having ordinary phases. As illustrated in FIG. 10, the first, second, third and fourth internal strobe signals IDQS, QDQS, IDQSB and QDQSB may be generated to form and to have reverse phases from a point of time that the write latency WL and a period "tDQSS" elapses after the write command signal WT is inputted to the semiconductor device. That is, in the event that the third, fourth, first and second internal strobe signals IDQSB, QDQSB, IDQS and QDQS are sequentially generated at points of time "T21", "T22", "T23" and "T24", respectively, the first, second, third and fourth internal strobe signals IDQS, QDQS, IDQSB and QDQSB may be regarded as having reverse phases. In an embodiment, it may be assumed that the write latency WL is set to be two and the period "tDQSS" is set to be "1tCK". The period "tDQSS" denotes a specification to a domain crossing margin between the data strobe signal DQS and the clock signal CLK. In more detail, a time period from the rising edge of the clock signal CLK at which an external write command is input to the first rising edge of the data strobe signal DQS when a first data is input, is referred to the period "tDQSS".

Figure 11:
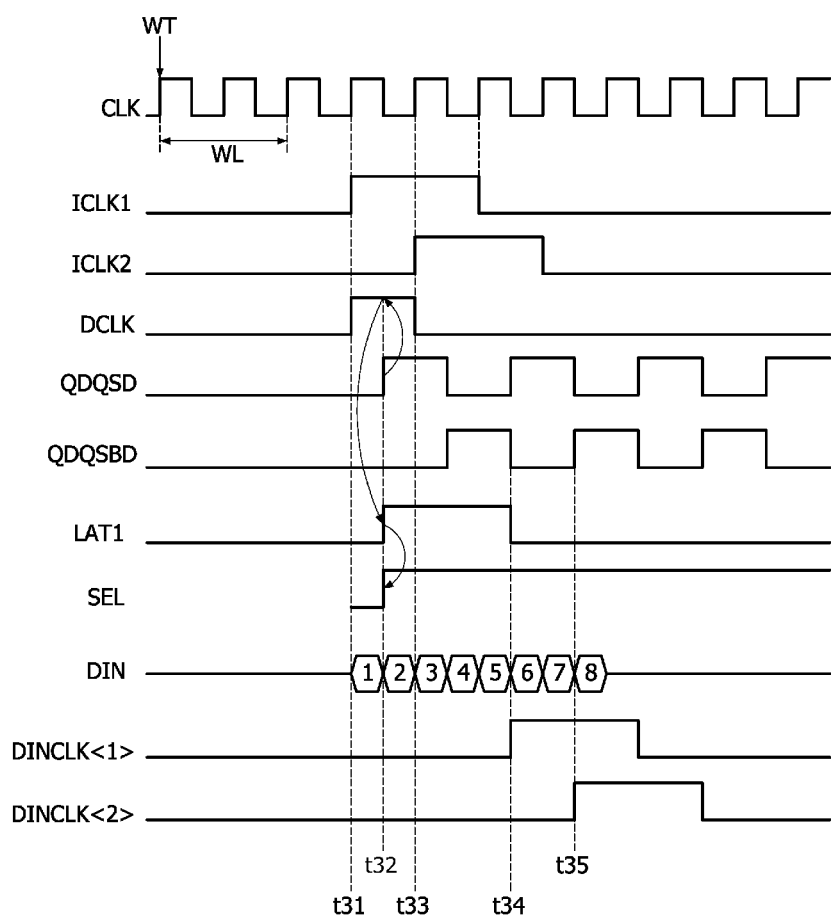
FIG. 11 is a timing diagram representation illustrating an operation for generating a selection signal and data input clock signals when internal strobe signals have ordinary phases.

FIG. 11 illustrates an operation of generating the selection signal SEL and the first and second data input clock signals DINCLK<1:2> when the first, second, third and fourth internal strobe signals IDQS, QDQS, IDQSB and QDQSB are generated to form and to have ordinary phases. The control clock signal DCLK may be generated to have a logic "high" level during a period from a point of time "T31" where a rising edge of the first internal clock signal ICLK1 occurs till a point of time "T33" where a rising edge of the second internal clock signal ICLK2 occurs. At a point of time "T32", the first latch signal LAT1 may be generated to have a logic "high" level in synchronization with a rising edge of the delayed strobe signal QDQSD. Moreover, at the point of time "T32", the selection signal SEL may be set to have a logic "high" level by the first latch signal LAT1. The first latch signal LAT1 may be shifted by one cycle of the delayed strobe signal QDQSD to generate a pulse of the first data input clock signal DINCLK<1> at a point of time "T34". At a point of time "T35", the first latch signal LAT1 may also be shifted by one and half cycles of the delayed strobe signal QDQSD to generate a pulse of the second data input clock signal DINCLK<2>. In an embodiment, the point of time "T34" where a pulse of the first data input clock signal DINCLK<1> occurs may be set to correspond to a point of time where a sixth data of the data DIN is inputted, and the point of time "T35" where a pulse of the second data input clock signal DINCLK<2> occurs may be set to correspond to a point of time where an eighth data of the data DIN is inputted. However, the points of time "T34" and "T35" where the pulses of the first and second data input clock signals DINCLK<1:2> occur may be set to be different according to the various embodiments.

Figure 12:
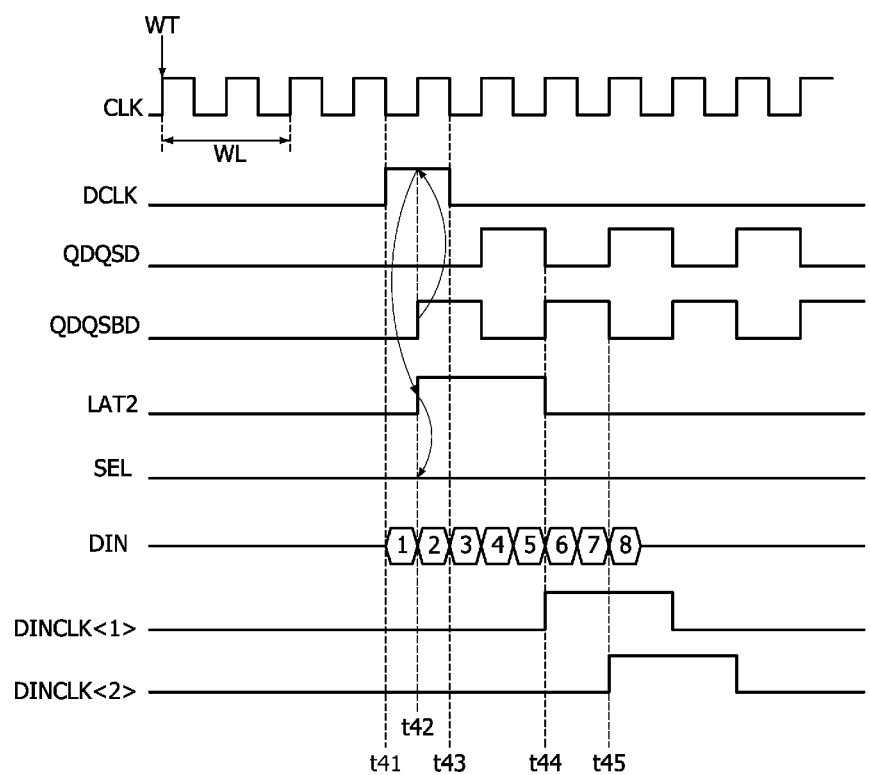
FIG. 12 is a timing diagram representation illustrating an operation for generating a selection signal and data input clock signals when internal strobe signals have reverse phases.

FIG. 12 illustrates an operation of generating the selection signal SEL and the first and second data input clock signals DINCLK<1:2> when the first, second, third and fourth internal strobe signals IDQS, QDQS, IDQSB and QDQSB are generated to form and to have the reverse phases. The control clock signal DCLK may be generated to have a logic "high" level during a period from a point of time "T41" till a point of time "T43". At a point of time "T42", the second latch signal LAT2 may be generated to have a logic "high" level in synchronization with a rising edge of the complementary delayed strobe signal QDQSBD. At the point of time "T42", the selection signal SEL may be set to have a logic "low" level by the second latch signal LAT2. At a point of time "T44", the second latch signal LAT2 may be shifted by one cycle of the complementary delayed strobe signal QDQSBD to generate a pulse of the first data input clock signal DINCLK<1>. At a point of time "T45", the second latch signal LAT2 may also be shifted by one and half cycles of the complementary delayed strobe signal QDQSBD to generate a pulse of the second data input clock signal DINCLK<2>. In an embodiment, the point of time "T44" that a pulse of the first data input clock signal DINCLK<1> occurs may be set to correspond to a point of time that a sixth data of the data DIN is inputted, and the point of time "T45" that a pulse of the second data input clock signal DINCLK<2> occurs may be set to correspond to a point of time that an eighth data of the data DIN is inputted. However, the points of time "T44" and "T45" that the pulses of the first and second data input clock signals DINCLK<1:2> occur may be set to be different according to the various embodiments.

Figure 13:
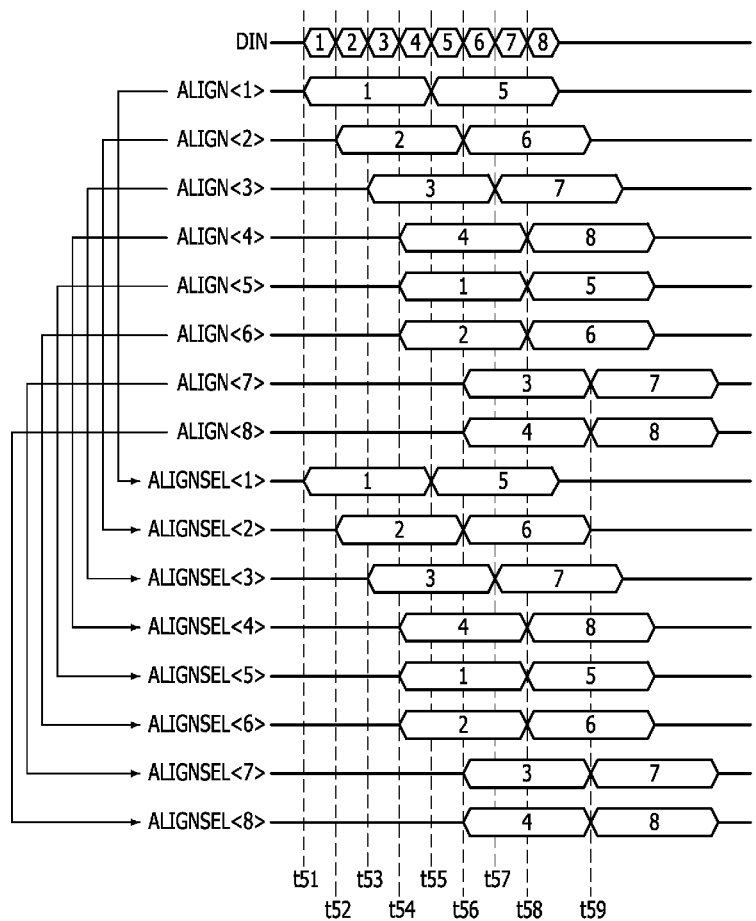
FIG. 13 is a timing diagram representation illustrating an operation for generating alignment data and selection alignment data when internal strobe signals have ordinary phases.

FIG. 13 illustrates an operation of generating the first to eighth alignment data ALIGN<1:8> and the first to eighth selection alignment data ALIGNSEL<1:8> when the first, second, third and fourth internal strobe signals IDQS, QDQS, IDQSB and QDQSB are generated to form and to have the ordinary phases.

To sequentially generate the first, second, third and fourth alignment data ALIGN<1:4>, the data DIN may be latched in synchronization with the clock signal CLK. The first alignment data ALIGN<1> may be generated by a first data of the data DIN which is latched at a point of time "T51" and by a fifth data of the data DIN which is latched at a point of time "T55". The second alignment data ALIGN<2> may be generated by a second data of the data DIN which is latched at a point of time "T52" and by a sixth data of the data DIN which is latched at a point of time "T56". The third alignment data ALIGN<3> may be generated by a third data of the data DIN which is latched at a point of time "T53" and by a seventh data of the data DIN which is latched at a point of time "T57". The fourth alignment data ALIGN<4> may be generated by a fourth data of the data DIN which is latched at a point of time "T54" and by an eighth data of the data DIN which is latched at a point of time "T58". The first alignment data ALIGN<1> may be retarded to generate the fifth alignment data ALIGN<5>. The second alignment data ALIGN<2> may be retarded to generate the sixth alignment data ALIGN<6>. The third alignment data ALIGN<3> may be retarded to generate the seventh alignment data ALIGN<7>. The fourth alignment data ALIGN<4> may be retarded to generate the eighth alignment data ALIGN<8>. As a result, the fifth alignment data ALIGN<5> may be generated by the first data of the data DIN which is latched at the point of time "T54" and by the fifth data of the data DIN which is latched at the point of time "T58". Also as a result, the sixth alignment data ALIGN<6> may be generated by the second data of the data DIN which is latched at the point of time "T54" and by the sixth data of the data DIN which is latched at the point of time "T58". Moreover, the seventh alignment data ALIGN<7> may be generated by the third data of the data DIN which is latched at the point of time "T56" and by the seventh data of the data DIN which is latched at a point of time "T59". Also, the eighth alignment data ALIGN<8> may be generated by the fourth data of the data DIN which is latched at the point of time "T56" and by the eighth data of the data DIN which is latched at the point of time "T59".

The selection signal SEL may have a logic "high" level because the first, second, third and fourth internal strobe signals IDQS, QDQS, IDQSB and QDQSB are generated to form and to have ordinary phases. Thus, the first alignment data group ALIGN<1,2,5,6> may be outputted as the first selection alignment data group ALIGNSEL<1,2,5,6>. Additionally, the second alignment data group ALIGN<3,4,7,8> may be outputted as the second selection alignment data group ALIGNSEL<3,4,7,8>. As such, the first alignment data ALIGN<1> may be outputted as the first selection alignment data ALIGNSEL<1>. The second alignment data ALIGN<2> may be outputted as the second selection alignment data ALIGNSEL<2>. The third alignment data ALIGN<3> may be outputted as the third selection alignment data ALIGNSEL<3>. The fourth alignment data ALIGN<4> may be outputted as the fourth selection alignment data ALIGNSEL<4>. The fifth alignment data ALIGN<5> may be outputted as the fifth selection alignment data ALIGNSEL<5>. The sixth alignment data ALIGN<6> may be outputted as the sixth selection alignment data ALIGNSEL<6>. The seventh alignment data ALIGN<7> may be outputted as the seventh selection alignment data ALIGNSEL<7>. Finally, the eighth alignment data ALIGN<8> may be outputted as the eighth selection alignment data ALIGNSEL<8>.

Figure 14:
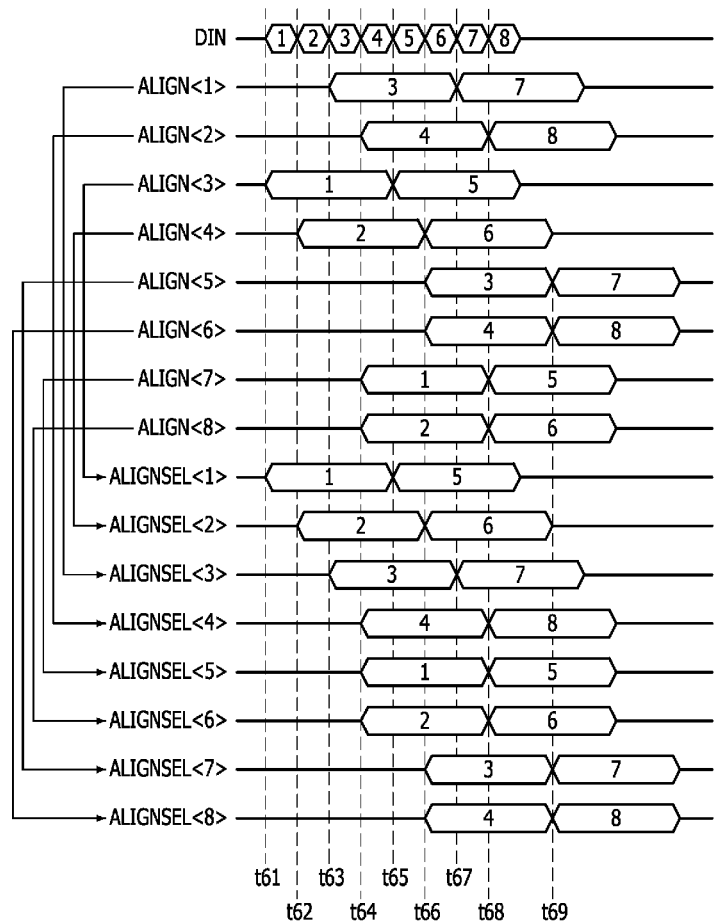
FIG. 14 is a timing diagram representation illustrating an operation for generating alignment data and selection alignment data when internal strobe signals have reverse phases.

FIG. 14 illustrates an operation of generating the first to eighth alignment data ALIGN<1:8> and the first to eighth selection alignment data ALIGNSEL<1:8> when the first, second, third and fourth internal strobe signals IDQS, QDQS, IDQSB and QDQSB are generated to form and to have reverse phases.

The data DIN may be sequentially latched in synchronization with the clock signal CLK to generate the first, second, third and fourth alignment data ALIGN<1:4>. The third alignment data ALIGN<3> may be generated by the first data of the data DIN which is latched at a point of time "T61" and by the fifth data of the data DIN which is latched at a point of time "T65". The fourth alignment data ALIGN<2> may be generated by the second data of the data DIN which is latched at a point of time "T62" and by the sixth data of the data DIN which is latched at a point of time "T66". The first alignment data ALIGN<1> may be generated by the third data of the data DIN which is latched at a point of time "T63" and by the seventh data of the data DIN which is latched at a point of time "T67". The second alignment data ALIGN<2> may be generated by the fourth data of the data DIN which is latched at a point of time "T64" and by the eighth data of the data DIN which is latched at a point of time "T68". The first alignment data ALIGN<1> may be retarded to generate the fifth alignment data ALIGN<5>. The second alignment data ALIGN<2> may be retarded to generate the sixth alignment data ALIGN<6>. The third alignment data ALIGN<3> may be retarded to generate the seventh alignment data ALIGN<7>. The fourth alignment data ALIGN<4> may be retarded to generate the eighth alignment data ALIGN<8>. As a result, the seventh alignment data ALIGN<7> may be generated by the first data of the data DIN which is latched at the point of time "T64" and by the fifth data of the data DIN which is latched at the point of time "T68". Also as a result, the eighth alignment data ALIGN<8> may be generated by the second data of the data DIN which is latched at the point of time "T64" and by the sixth data of the data DIN which is latched at the point of time "T68". Moreover, the fifth alignment data ALIGN<5> may be generated by the third data of the data DIN which is latched at the point of time "T66" and by the seventh data of the data DIN which is latched at a point of time "T69". Additionally, the sixth alignment data ALIGN<6> may be generated by the fourth data of the data DIN which is latched at the point of time "T66" and by the eighth data of the data DIN which is latched at the point of time "T69".

The selection signal SEL may have a logic "low" level because the first, second, third and fourth internal strobe signals IDQS, QDQS, IDQSB and QDQSB are generated to form and to have reverse phases. Thus, the first alignment data group ALIGN<1,2,5,6> may be outputted as the second selection alignment data group ALIGNSEL<3,4,7,8>. Additionally, the second alignment data group ALIGN<3,4,7,8> may be outputted as the first selection alignment data group ALIGNSEL<1,2,5,6>. Also, the first alignment data ALIGN<1> may be outputted as the third selection alignment data ALIGNSEL<3>. The second alignment data ALIGN<2> may be outputted as the fourth selection alignment data ALIGNSEL<4>. The fifth alignment data ALIGN<5> may be outputted as the seventh selection alignment data ALIGNSEL<7>. The sixth alignment data ALIGN<6> may be outputted as the eighth selection alignment data ALIGNSEL<8>. The third alignment data ALIGN<3> may be outputted as the first selection alignment data ALIGNSEL<1>. The fourth alignment data ALIGN<4> may be outputted as the second selection alignment data ALIGNSEL<2>. The seventh alignment data ALIGN<7> may be outputted as the fifth selection alignment data ALIGNSEL<5>. Finally, the eighth alignment data ALIGN<8> may be outputted as the sixth selection alignment data ALIGNSEL<6>.

Figure 15:
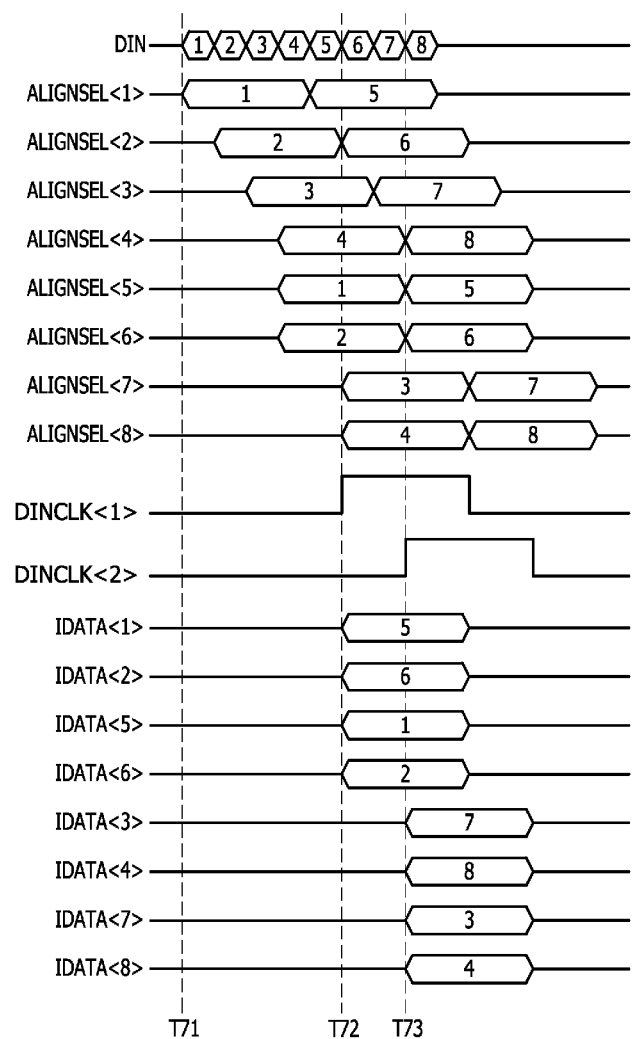
FIG. 15 is a timing diagram representation illustrating an operation for generating internal data.

FIG. 15 illustrates an operation of generating the first to eighth internal data IDATA<1:8>. If the data DIN is inputted to the semiconductor device at a point of time "T71", the first to eighth selection alignment data ALIGNSEL<1:8> are aligned from the point of time "T71", a pulse of the first data input clock signal DINCLK<1> may be generated at a point of time "T72", and a pulse of the second data input clock signal DINCLK<2> may be generated at a point of time "T73". The operation of aligning the first to eighth selection alignment data ALIGNSEL<1:8> and the operation of generating the first and second data input clock signals DINCLK<1:2> have been already described in detail with reference to FIGS. 11 to 14.

At the point of time "T72", the first internal data IDATA<1> may be generated by a second data of the first selection alignment data ALIGNSEL<1> which is latched in synchronization with the first data input clock signal DINCLK<1>. At the point of time "T72", the second internal data IDATA<2> may be generated by a second data of the second selection alignment data ALIGNSEL<2> which is latched in synchronization with the first data input clock signal DINCLK<1>. At the point of time "T72", the fifth internal data IDATA<5> may be generated by a first data of the fifth selection alignment data ALIGNSEL<5> which is latched in synchronization with the first data input clock signal DINCLK<1>. At the point of time "T72", the sixth internal data IDATA<6> may be generated by a first data of the sixth selection alignment data ALIGNSEL<6> which is latched in synchronization with the first data input clock signal DINCLK<1>. At the point of time "T73", the third internal data IDATA<3> may be generated by a second data of the third selection alignment data ALIGNSEL<3> which is latched in synchronization with the second data input clock signal DINCLK<2>. At the point of time "T73", the fourth internal data IDATA<4> may be generated by a second data of the fourth selection alignment data ALIGNSEL<4> which is latched in synchronization with the second data input clock signal DINCLK<2>. At the point of time "T73" the seventh internal data IDATA<7> may be generated by a first data of the seventh selection alignment data ALIGNSEL<7> which is latched in synchronization with the second data input clock signal DINCLK<2>. At the point of time "T73", the eighth internal data IDATA<8> may be generated by a first data of the eighth selection alignment data ALIGNSEL<8> which is latched in synchronization with the second data input clock signal DINCLK<2>.

Figure 16:
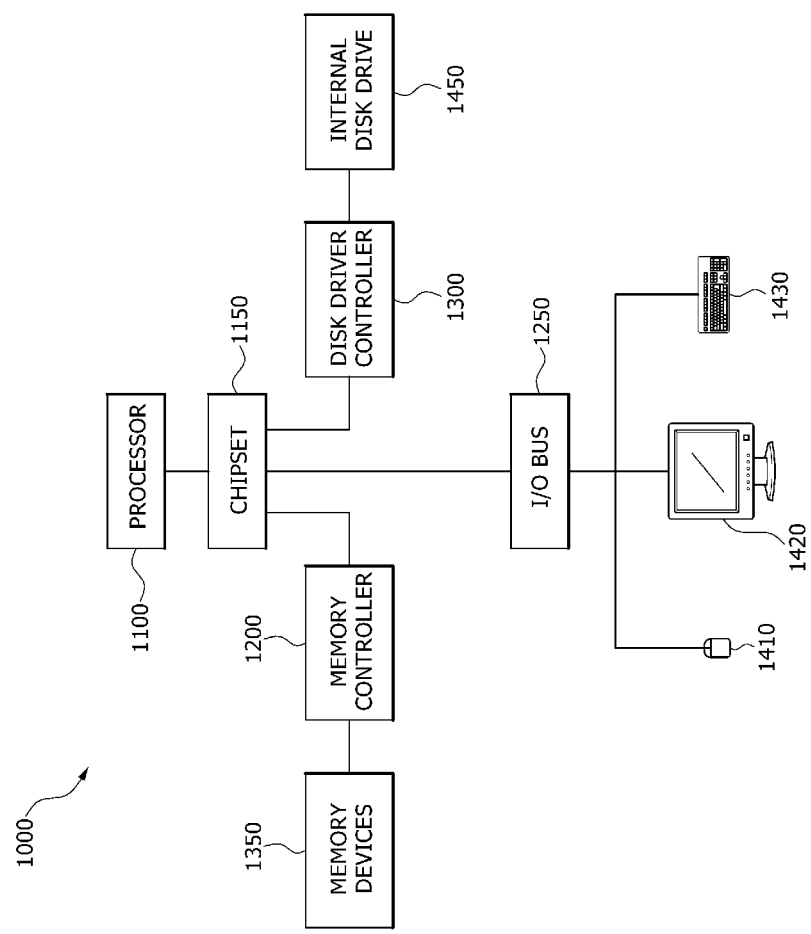
FIG. 16 illustrates a block diagram representation of an example of a system employing the semiconductor device in accordance with the embodiments discussed above with relation to FIGS. 1-14.

The semiconductor devices discussed above are particular useful in the design of memory devices, processors, and computer systems. For example, referring to FIG. 16, a block diagram of a system employing the semiconductor device in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor device as discussed above with reference to FIGS. 1-15. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor device as discussed above with relation to FIGS. 1-15, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 16 is merely one example of a system employing the semiconductor device as discussed above with relation to FIGS. 1-15. In alternate embodiments, such as cellular phones or digital cameras, the components may differ from the embodiments illustrated in FIG. 16.

As described above, a semiconductor device according to the embodiments may align data when internal strobe signals having different phases are generated to form or to have ordinary phases or reverse phases and may divide the aligned data into a plurality of grouped data including complementary data having opposite phases to selectively output the grouped data. Thus, the semiconductor device may receive and align the data without any errors regardless of the phases of the internal strobe signals.

What is claimed is:

1. A semiconductor device comprising:
a data aligner suitable for aligning input data in response to internal strobe signals obtained by dividing a data strobe signal to generate first alignment data and second alignment data;
a phase sensor suitable for generating a control clock signal in response to a clock signal and suitable for sensing phases of the internal strobe signals with the control clock signal to generate a selection signal; and
a data selector suitable for selectively outputting the first and second alignment data as a first selection alignment data and a second selection alignment data in response to the selection signal.

2. The semiconductor device of claim 1,
wherein the phase sensor includes a control clock generator suitable for generating first and second internal clock signals from the clock signal and suitable for generating the control clock signal having a pulse width corresponding to a phase difference between the first and second internal clock signals.

3. The semiconductor device of claim 2,
wherein a pulse of the first internal clock signal occurs at a point of time when a write latency and an integer number times a cycle of the clock signal elapse from a moment when a write command signal is inputted, and a pulse of the second internal clock signal occurs at a point of time when a write latency and another integer number times a cycle of the clock signal elapse from a moment when a write command signal is inputted.

4. The semiconductor device of claim 2, wherein the control clock signal has a pulse width corresponding to a period from a rising edge of the first internal clock signal until a rising edge of the second internal clock signal.

5. The semiconductor device of claim 2, wherein the phase sensor further includes a delay unit suitable for retarding the internal strobe signals to generate a delayed strobe signal and a complementary delayed strobe signal.

6. The semiconductor device of claim 5, wherein the phase sensor further includes a latch synthesizer suitable for latching the control clock signal in synchronization with the delayed strobe signal and the complementary delayed strobe signal to generate a first latch signal and a second latch signal and suitable for generating the selection signal in response to the first and second latch signals.

7. The semiconductor device of claim 6, wherein the latch synthesizer includes:
a first latch unit suitable for latching the control clock signal in synchronization with the delayed strobe signal to generate the first latch signal;
a second latch unit suitable for latching the control clock signal in synchronization with the complementary delayed strobe signal to generate the second latch signal; and
a selection signal generator suitable for synthesizing the first and second latch signals to generate the selection signal.

8. The semiconductor device of claim 6, further comprising a data input clock generator suitable for shifting the first and second latch signals to generate a first shift signal and a second shift signal and suitable for generating a data input clock signal in response to the first and second shift signals.

9. The semiconductor device of claim 8, wherein the data input clock generator includes:
a first shifter suitable for shifting the first latch signal to generate the first shift signal;

a second shifter suitable for shifting the second latch signal to generate the second shift signal; and a synthesizer suitable for synthesizing the first and second shift signals to generate the data input clock signal.

10. The semiconductor device of claim 8, further comprising an internal data generator suitable for latching the first and second selection alignment data in response to the data input clock signal to generate internal data.

11. The semiconductor device of claim 6, wherein the selection signal is set to have a first level in response to the first latch signal, and the selection signal is set to have a second level in response to the second latch signal.

12. The semiconductor device of claim 11, wherein the data selector outputs the first alignment data as the first selection alignment data and outputs the second alignment data as the second selection alignment data when the selection signal is set to have the first level, and the data selector outputs the first alignment data as the second selection alignment data and outputs the second alignment data as the first selection alignment data when the selection signal is set to have the second level.

13. A semiconductor device comprising:

a data aligner suitable for aligning input data in response to internal strobe signals obtained by dividing a data strobe signal to generate first alignment data and second alignment data; and a data controller suitable for generating a control clock signal in response to a clock signal, suitable for sensing phases of the internal strobe signals with the control clock signal to generate a first latch signal, a second latch signal and a selection signal, and suitable for generating a data input clock signal for generation of internal data in response to the first and second latch signals.

14. The semiconductor device of claim 13, wherein the phase sensor includes a control clock generator suitable for generating first and second internal clock signals from the clock signal and suitable for generating the control clock signal having a pulse width corresponding to a phase difference between the first and second internal clock signals.

15. The semiconductor device of claim 14, wherein a pulse of the first internal clock signal occurs at a point of time when a write latency and an integer number times a cycle of the clock signal elapse from a moment when a write command signal is inputted, and a pulse of the second internal clock signal occurs at a point of time when a write latency and another integer number times a cycle of the clock signal elapse from a moment when a write command signal is inputted.

16. The semiconductor device of claim 14, wherein the control clock signal has a pulse width corresponding to a period from a rising edge of the first internal clock signal until a rising edge of the second internal clock signal.

17. The semiconductor device of claim 13, wherein the data controller includes:

a delay unit suitable for retarding the internal strobe signals to generate a delayed strobe signal and a complementary delayed strobe signal; and a latch synthesizer suitable for latching the control clock signal in synchronization with the delayed strobe signal and the complementary delayed strobe signal to generate the first and second latch signals and suitable for generating the selection signal in response to the first and second latch signals.

18. The semiconductor device of claim 13, wherein the data controller includes a data input clock generator suitable for shifting the first and second latch signals to generate a first shift signal and a second shift signal and suitable for generating the data input clock signal in response to the first and second shift signals.

19. The semiconductor device of claim 13, further comprising a data selector suitable for selectively outputting the first and second alignment data as a first selection alignment data and a second selection alignment data in response to the selection signal.

20. The semiconductor device of claim 19, further comprising an internal data generator suitable for latching the first and second selection alignment data in response to the data input clock signal to generate internal data.

\* \* \* \* \*